United States Patent

Buti et al.

[11] Patent Number: 5,872,733
[45] Date of Patent: Feb. 16, 1999

[54] RAMP-UP RATE CONTROL CIRCUIT FOR FLASH MEMORY CHARGE PUMP

[75] Inventors: Taqi Nasser Buti, Millbrook; Louis Lu-Chen Hsu, Fishkill; Jente B. Kuang; Somnuk Ratanaphanyarat, both of Poughkeepsie; Mary Joseph Saccamango, Poughquag, all of N.Y.; Hyun Jong Shin, Ridgefield, Conn.

[73] Assignee: International Business Machines Corporation, Armonk, N.Y.

[21] Appl. No.: 730,628

[22] Filed: Oct. 21, 1996

[51] Int. Cl.$^6$ .................................. H03F 3/16; H03L 7/00
[52] U.S. Cl. .............................. 365/185.19; 365/185.18; 365/203; 365/204; 327/536
[58] Field of Search ..................... 330/277, 291; 365/185.19, 185.18, 203, 204; 327/536

[56] References Cited

U.S. PATENT DOCUMENTS

| | | |
|---|---|---|
| 2,873,387 | 2/1959 | Kidd . |
| 3,321,642 | 5/1967 | Peterson . |
| 3,369,129 | 2/1968 | Wolterman . |
| 3,403,265 | 9/1968 | Apfelbeck . |
| 3,535,549 | 10/1970 | Herrero . |
| 3,603,811 | 9/1971 | Day et al. . |
| 3,878,403 | 4/1975 | Willite et al. . |
| 3,946,251 | 3/1976 | Kawagoe . |
| 4,326,134 | 4/1982 | Owen et al. . |
| 4,488,060 | 12/1984 | Simko . |
| 4,739,282 | 4/1988 | Scheinberg ............................ 330/277 |
| 4,958,093 | 9/1990 | Kosson et al. . |
| 5,041,889 | 8/1991 | Kriedt et al. . |
| 5,075,572 | 12/1991 | Poteet et al. . |
| 5,120,668 | 6/1992 | Hsu et al. ................................. 437/41 |
| 5,157,289 | 10/1992 | Vasile . |
| 5,172,409 | 12/1992 | Susak . |
| 5,182,468 | 1/1993 | Erdelyi et al. . |
| 5,233,314 | 8/1993 | McDermott et al. ..................... 331/17 |
| 5,234,535 | 8/1993 | Beyer et al. ............................. 156/630 |
| 5,247,241 | 9/1993 | Ueda ........................................ 323/312 |
| 5,258,318 | 11/1993 | Buti et al. ................................. 437/34 |
| 5,276,338 | 1/1994 | Beyer et al. .............................. 257/52 |
| 5,359,299 | 10/1994 | Webster . |
| 5,365,121 | 11/1994 | Morton et al. . |
| 5,391,510 | 2/1995 | Hsu et al. ................................. 437/44 |
| 5,405,795 | 4/1995 | Beyer et al. .............................. 437/41 |
| 5,459,437 | 10/1995 | Campbell ................................ 331/111 |
| 5,466,625 | 11/1995 | Hsieh et al. .............................. 437/52 |
| 5,484,738 | 1/1996 | Chu et al. ................................. 437/33 |
| 5,521,399 | 5/1996 | Chu et al. ................................. 257/36 |

(List continued on next page.)

OTHER PUBLICATIONS

"A Quick Boosting Charge Pump Circuit for High Density and Low Voltage Flash Memories", Tanzawa et al., 1994.

*Primary Examiner*—Viet Q. Nguyen
*Attorney, Agent, or Firm*—DeLio & Peterson, LLC; Peter W. Peterson; Joseph P. Abate

[57] ABSTRACT

An apparatus for controlling the ramp-up rate of a charge pump having an output providing an output voltage and an output current. In one embodiment, the apparatus comprises a current bleeder circuit having an input, an output adapted for connection to ground potential and at least one transistor having a gate, source, drain and body and defining at least one current path between the source and drain to form a current path between the input and output. The body is adapted for connection to the charge pump output. The apparatus further comprises a control circuit having an input adapted for connection to the charge pump output and an output connected to the bleeder circuit input. The control circuit provides a voltage potential to the input of the current bleeder circuit to control the gate-to-source voltage of the current bleeder circuit transistor. The flow of current through the current path of the current bleeder path is a function of the magnitude of the charge pump output and the gate-to-source voltage of the bleeder circuit transistor. Other embodiments of the apparatus of the present invention are described herein.

9 Claims, 9 Drawing Sheets

U.S. PATENT DOCUMENTS

| | | | |
|---|---|---|---|
| 5,528,062 | 6/1996 | Hsieh et al. | 257/298 |
| 5,561,385 | 10/1996 | Choi | 327/536 |
| 5,567,533 | 10/1996 | Hsu et al. | 430/5 |
| 5,573,964 | 11/1996 | Hsu et al. | 437/40 |
| 5,599,725 | 2/1997 | Dorleans et al. | 437/40 |
| 5,622,881 | 4/1997 | Acocella et al. | 438/264 |
| 5,633,522 | 5/1997 | Dorleans et al. | 257/344 |
| 5,643,813 | 7/1997 | Acocella et al. | 437/43 |
| 5,663,578 | 9/1997 | Hsu et al. | 257/66 |
| 5,675,164 | 10/1997 | Brunner et al. | 257/331 |
| 5,689,127 | 11/1997 | Chu et al. | 257/329 |
| 5,729,039 | 3/1998 | Beyer et al. | 257/347 |
| 5,736,891 | 4/1998 | Buti et al. | 327/434 |
| 5,753,525 | 5/1998 | Hsu et al. | 437/43 |
| 5,759,907 | 6/1998 | Assaderaghi et al. | 438/386 |

RAMP-UP RATE CONTROL CIRCUIT FOR FLASH MEMORY CHARGE PUMP

BACKGROUND OF THE INVENTION

1. Field of the Invention

The present invention relates generally to charge pumps, and more particularly, to a circuit for controlling the charge pump ramp-up rate.

2. Problem to be Solved

Flash memory devices are typically nonvolatile memories that are reprogrammable. Such devices are Electrically Erasable Programmable Read Only Memories (EEPROM). Typically, the flash memory cells are arranged in an array and are located at the intersections of rows (word lines) and columns (bit lines). A cell is typically comprised of a floating gate transistor and a select transistor. The floating gate transistors are programmed by grounding the control electrode and raising the drain voltage. Tunneling causes electrons to be transferred from the substrate to the floating-gate through a thin tunneling oxide layer. A programming voltage pulse between about 18–20 volts may be needed to induce tunneling. As charge builds up on the floating gate, the electric field is reduced, decreasing electron flow. During programming, the select transistor is used to isolate the unselected memory cells that are located on the same column. Erasing of the memory cell is accomplished by applying a high programming voltage pulse to the control electrode of the floating-gate transistor.

High programming voltages result in overstress of the flash memory device. Such overstress limits the number of programming cycles performed on a flash memory device thereby shortening the useful lifetime of the memory device. The peak tunneling current has a direct bearing on the reliability and service life of the memory device. The peak tunneling current is directly related to the ramp-up rate of the programming voltage pulse outputted by a charge pump. If the ramp-up rate of the programming voltage pulse is too high, the peak tunneling current may overstress the thin tunneling oxide layer resulting in reduced reliability and shortened service life.

One attempt at solving the aforementioned problem is the utilization of a weak charge pump configuration. Such a configuration uses several pumps, each of which using smaller pump-capacitor values and lower pump-oscillator frequencies. However, for flash memory applications, the connection scheme of the charge pumps is complex, requires a relatively large chip area and consumes a relatively large amount of power. Furthermore, weak charge pumps provide a ramp-up rate that is too low thereby increasing the time required for programming and erasing operations.

Thus, it is an object of the present invention to provide a control circuit for accurately and efficiently controlling the ramp-up rate of a charge pump used for programming flash memory devices.

It is another object of the present invention to provide a control circuit for controlling the ramp-up rate of a charge pump used for programming and erasing a flash memory device so as to prevent overstressing the flash memory device.

It is a further object of the present invention to provide a control circuit for controlling the ramp-up rate of a charge pump that allows for the use of only one charge pump for performing operations on flash memory devices.

It is another object of the present invention to provide a control circuit for controlling the ramp-up rate of a charge pump which can be implemented with modern sub-half micron CMOS technology.

SUMMARY OF THE INVENTION

The above and other objects and advantages, which will be apparent to those skilled in the art, are achieved in the present invention which is directed to, in a first aspect, an apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit having an input adapted for connection to the charge pump output and an output connected to the bleeder circuit input, the control circuit providing a voltage potential to the input of the current bleeder circuit to control the gate-to-source voltage of the current bleeder circuit transistor; and wherein the flow of current through the current path of the current bleeder path is a function of the magnitude of the charge pump output and the gate-to-source voltage of the bleeder circuit transistor.

In a related aspect, the present invention is directed to an apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit comprising:

a first circuit having an input adapted for connection to the charge pump output and an output connected to the current bleeder circuit input, the first circuit comprising a transistor having a gate, source, and drain and defining a current path between the source and drain to form a current path between the first circuit input and first circuit output, the connection of the first circuit output and the bleeder circuit input defining a node, a second circuit for outputting a signal to the gate of the first circuit transistor to (1) substantially isolate the first circuit input from the first circuit output when the magnitude of the charge pump output voltage is greater than or equal to a predetermined magnitude, and (2) couple the first circuit input to the first circuit output when the magnitude of the charge pump output voltage is less than the predetermined magnitude, and a voltage setting circuit for maintaining the node at a voltage potential to control the gate-to-source voltage of the current bleeder circuit transistor;

wherein the flow of current through the current path of the current bleeder circuit is a function of the magnitude of the charge pump output and the gate-to-source voltage of the bleeder circuit transistor.

In a further aspect, the present invention is directed to an apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit comprising:

a first circuit having an input adapted for connection to the charge pump output and an output connected to the current bleeder circuit input, the first circuit comprising a plurality of transistors, each having a gate, source and drain and defining a current path between the first circuit input and first circuit output, the connection of the first circuit output and the bleeder circuit input defining a node, and a second circuit comprising a plurality of networks, each network having an output connected to the gate of a corresponding first circuit transistor, each network determining for each first circuit current path a particular magnitude of the charge pump output voltage wherein the network outputs a signal to the gate of the corresponding first circuit transistor to (1) substantially eliminate current flow through the first circuit current path when the magnitude of the charge pump output voltage is greater than or equal to the predetermined magnitude, and (2) allow current flow through the first circuit current path when the magnitude of the charge pump output voltage is less than the predetermined magnitude, and a voltage setting circuit for maintaining the node at a voltage potential to control the gate-to-source voltage of the current bleeder circuit transistor;

wherein the flow of current through the current path of the current bleeder path is a function of the magnitude of the charge pump output and the gate-to-source voltage of the bleeder circuit transistor.

In another aspect, the present invention is directed to an apparatus for controlling the ramp-up rate of a charge pump having an output providing an output voltage and an output current, the apparatus comprising:

a first circuit having an input adapted for connection to the charge pump output and an output adapted for connection to ground potential, the first circuit having a transistor having a gate, source, and drain, the transistor defining a current path between the source and drain to form a current path between the first circuit input and first circuit output; and a second circuit for outputting a signal to the gate of the first circuit transistor to (1) substantially isolate the first circuit input from the first circuit output when the magnitude of the charge pump output voltage is greater than or equal to a predetermined magnitude, and (2) couple the first circuit input to the first circuit output when the magnitude of the charge pump output voltage is less than the predetermined magnitude.

In a further aspect, the present invention is directed to an apparatus for controlling the ramp-up rate of a charge pump having an output providing an output voltage and an output current, the apparatus comprising:

a first circuit having an input adapted for connection to the charge pump output and an output adapted for connection to ground potential, the first circuit having a plurality of transistors, each having a gate, source and drain and defining a current path between the first circuit input and first circuit output; and a second circuit comprising a plurality of networks, each network having an output connected to the gate of a corresponding first circuit transistor, each network determining for each current path a particular magnitude of the charge pump output voltage wherein the network outputs a signal to the gate of the corresponding transistor to (1) substantially eliminate current flow through the first circuit current path when the magnitude of the charge pump output voltage is greater than or equal to the predetermined magnitude, and (2) allow current flow through the first circuit current path when the magnitude of the charge pump output voltage is less than the predetermined magnitude.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

Figure 1A:
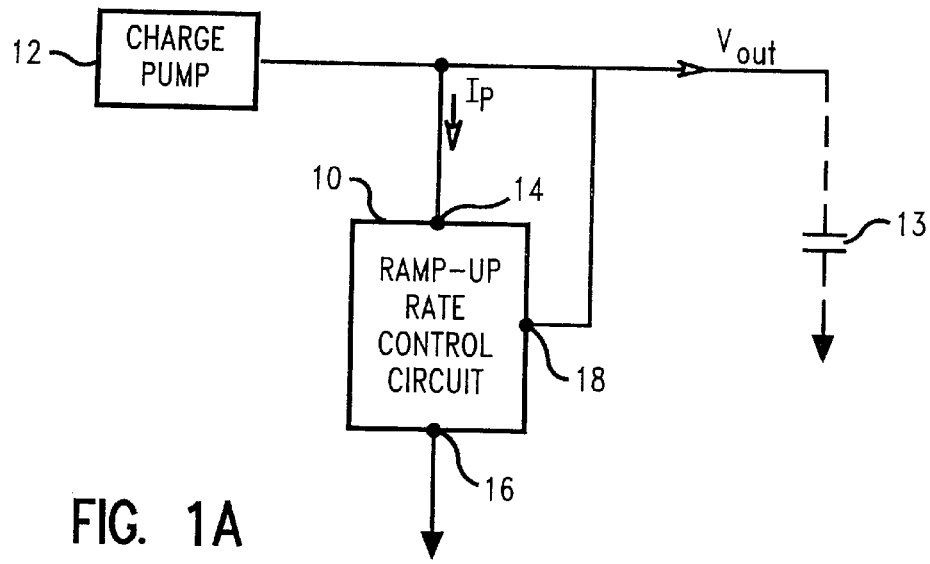
FIG. 1A is a block diagram of the charge pump ramp-up rate control apparatus of the present invention.

In describing the preferred embodiment of the present invention, reference will be made herein to FIGS. 1–6 of the drawings in which like numerals refer to like features of the invention. Features of the invention are not necessarily shown to scale in the drawings.

Referring to FIG. 1A, ramp-up rate control circuit 10 of the present invention generally consists of a self-controlled bleeding circuit for controlling the ramp-up speed of charge pump 12. The circuit includes input 14 connected to the charge pump output and output 16 connected to ground potential. The circuit includes control input 18 connected to the charge pump output. The circuit also includes a current path connected between input 14 and output 16. Circuit 10 is configured such that the conductivity of the current path is controlled by the magnitude of the charge pump voltage such that when the charge pump output voltage inputted to control input 18 is less than a predetermined magnitude, the current path is conductive and provides a current bleed path between the charge pump output and ground potential. When the magnitude of the charge pump output voltage inputted to circuit 10 is greater than or equal to the predetermined magnitude, the current flow path becomes nonconductive or highly resistive thereby substantially electrically isolating input 14 from output 16 to prevent charge pump bleed current from flowing to ground potential. Thus, control circuit 10 regulates the flow of charge pump bleed current Ip to ground potential by providing a current bleed path to ground potential upon the occurrence of predetermined conditions that are determined by the magnitude of the charge pump output voltage $V_{out}$. Capacitor 13, shown in phantom, represents a capacitive load presented by a flash memory device to the output of charge pump 12. The charge pump current can be any magnitude, depending on the size of the charge pump. Typically, the charge pump current is between about 0.5 milliampere and 0.5 ampere.

Ramp-up rate control circuit 10 may take the form of any one of the configurations discussed below. Other configurations embodying the concept of the present invention will be apparent to one skilled in the art.

Figure 1B:
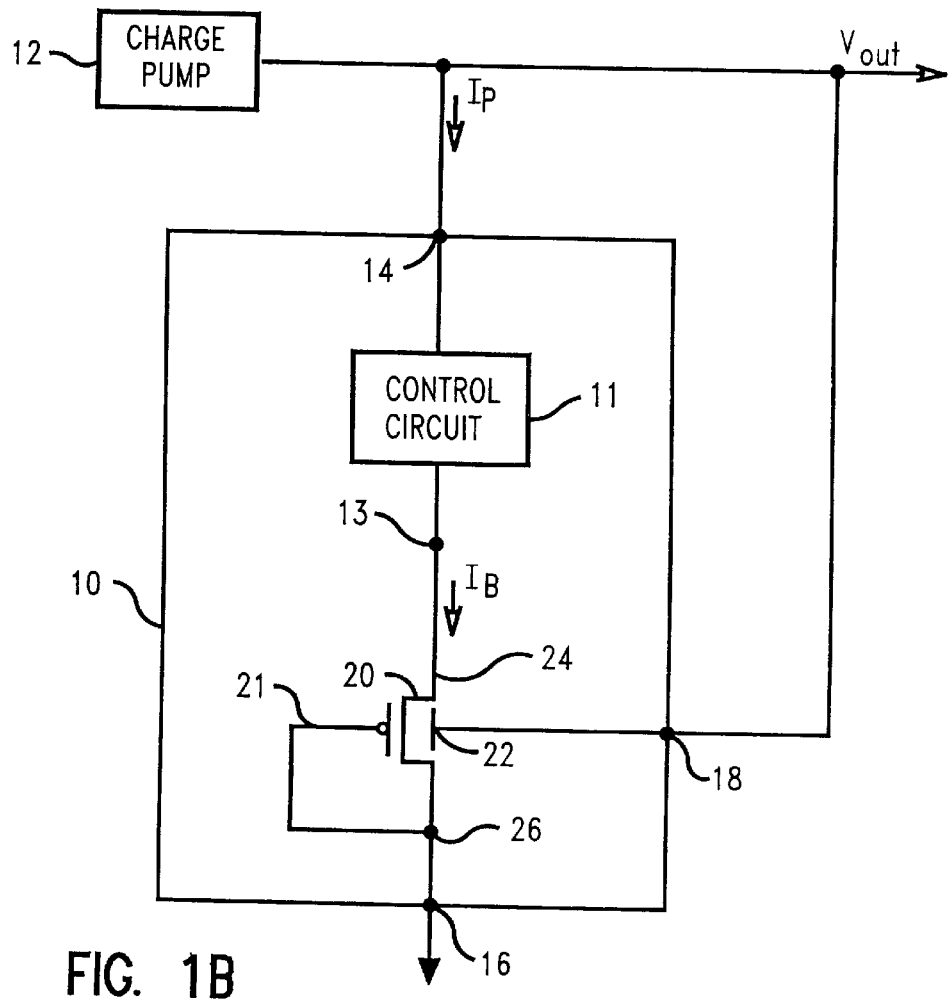
FIG. 1B is a circuit diagram of one embodiment of the charge pump ramp-up rate control circuit of the present invention.

One embodiment of circuit 10 is shown in FIG. 1B and comprises p-channel MOSFET ("FET") 20 and control circuit 11. FET 20 functions as a current bleeder circuit. Circuit 11 has an input coupled to input 14 and an output coupled to source 24 of FET 20. The connection of the output of circuit 11 and source 24 defines node 13. Circuit 11 functions to provide a substantially constant voltage potential at node 13. In addition, circuit 11 is preferably configured to either pass through essentially all of the charge pump bleed current $I_P$ or act as an additional current flow control.

Since gate 21 of FET 20 is connected to drain 26 which is connected to ground potential via output 16, the gate voltage $V_G$ is at ground potential. Thus, $|V_{GS}|$ of FET 20 is approximately equal to the voltage at node 13. The body or n-well 22 of FET 20 is connected to control input 18 which is connected to output voltage $V_{out}$ of charge pump 12. Thus, the body potential of FET 20 is modulated by the charge pump output voltage $V_{out}$ such that as $V_{out}$ increases, the threshold voltage $|V_{TH}|$ of FET 20 also increases. When $|V_{GS}|$ of FET 20 is greater than the threshold voltage $|V_{TH}|$, an electrically conductive path is produced between source 24 and drain 26 thereby allowing current $I_B$ to flow from source 24 to drain 26. As the threshold voltage $|V_{TH}|$ increases and becomes greater than $|V_{GS}|$, the resistance of the channel from source 24 to drain 26 increases which effects a decrease in the flow of current $I_B$ from source 24 to drain 26. Since control circuit 11 determines the magnitude of $|V_{GS}|$ of FET 20, circuit 11 in effect determines the magnitude of charge pump output voltage at which the current path from source 24 to drain 26 becomes highly resistive. Thus, FET 20 functions as a substrate-controlled switch that regulates the flow of bleeder current $I_B$ to ground potential as a function of the magnitude of the charge pump output voltage applied to the body 22 of FET 20 and the $|V_{GS}|$ of FET 20 as determined by circuit 11.

Figure 1C:
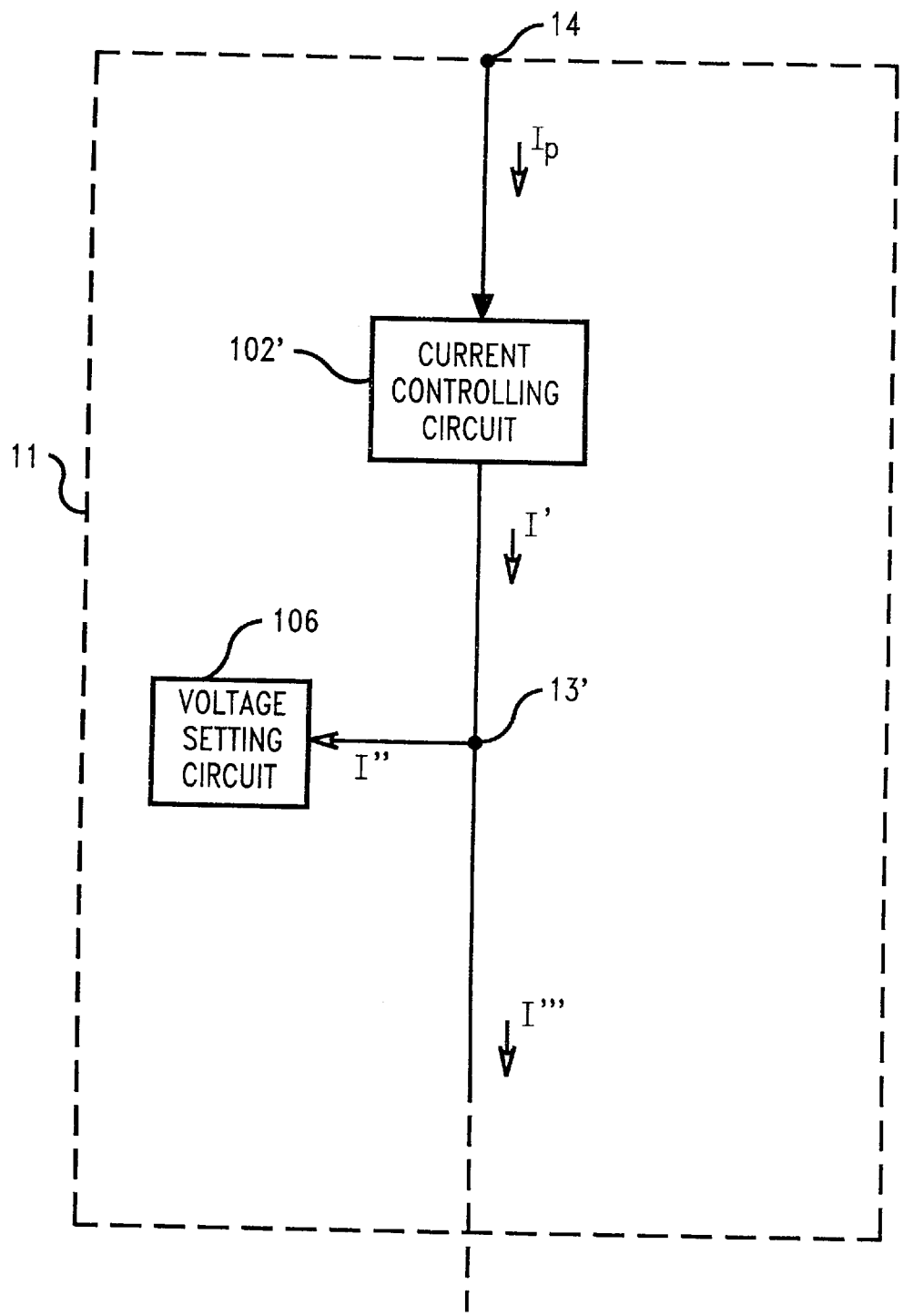
FIG. 1C is a block diagram of one embodiment of a control circuit shown in FIG. 1B.
Figure 5:
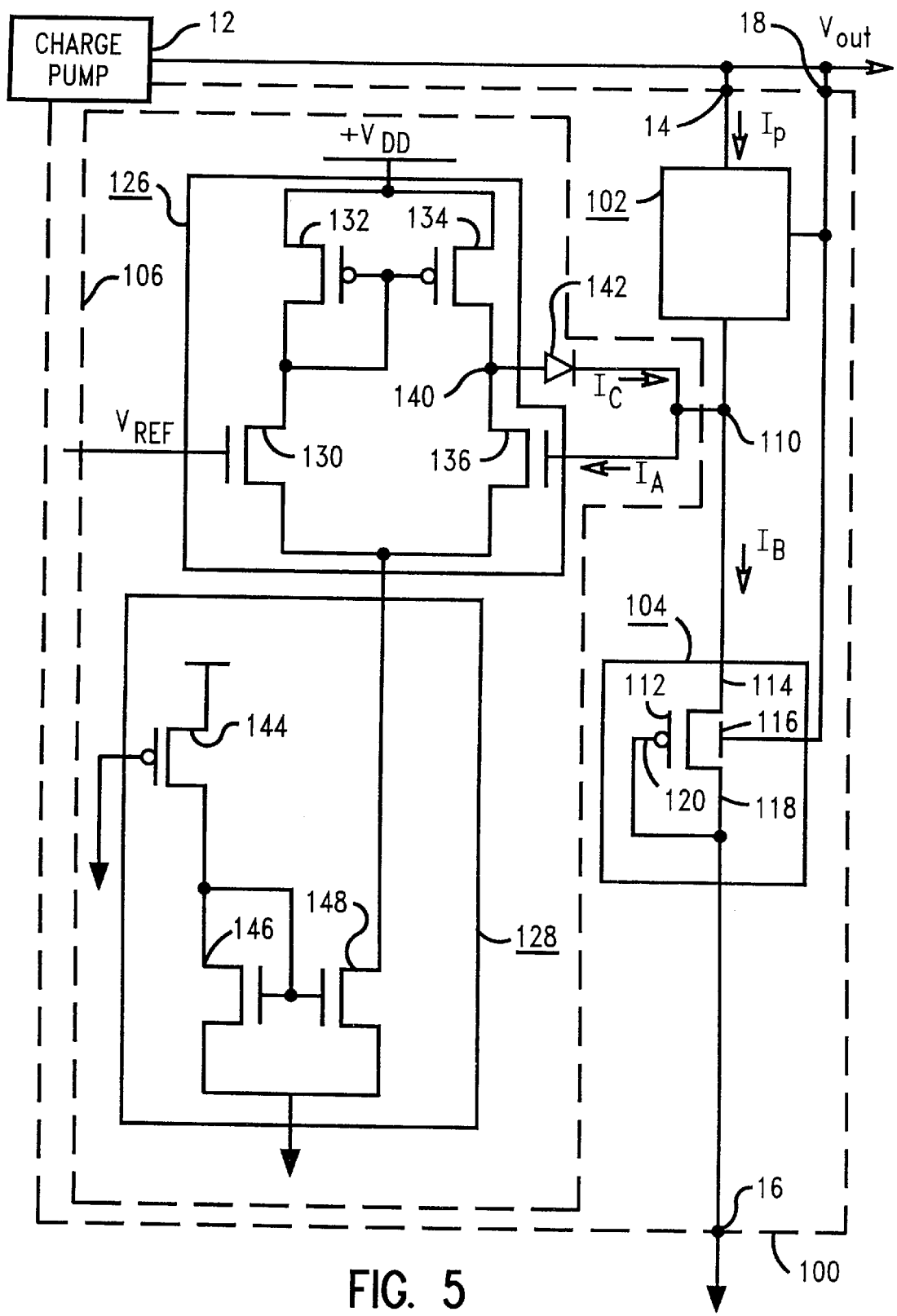
FIG. 5 is a circuit diagram of the preferred embodiment shown in FIG. 4.

Circuit 11 can be realized by a variety of circuits. A block diagram of circuit 11 is shown in FIG. 1C. Circuit 11 is comprised of voltage setting circuit 106 which effects a substantially constant voltage at node 13' while minimizing the current flow I" so that I' is substantially the same as I'". One embodiment of circuit 106 is shown in FIG. 5. Circuit 11 further comprises current-controlling circuit 102' that may either pass through essentially all of the current $I_P$ to I' or may act as an additional current flow control. Embodiments of circuit 102' that function as additional current flow controls include circuits 102A and 102B of FIGS. 2A and 3A, respectively.

Figure 2A:
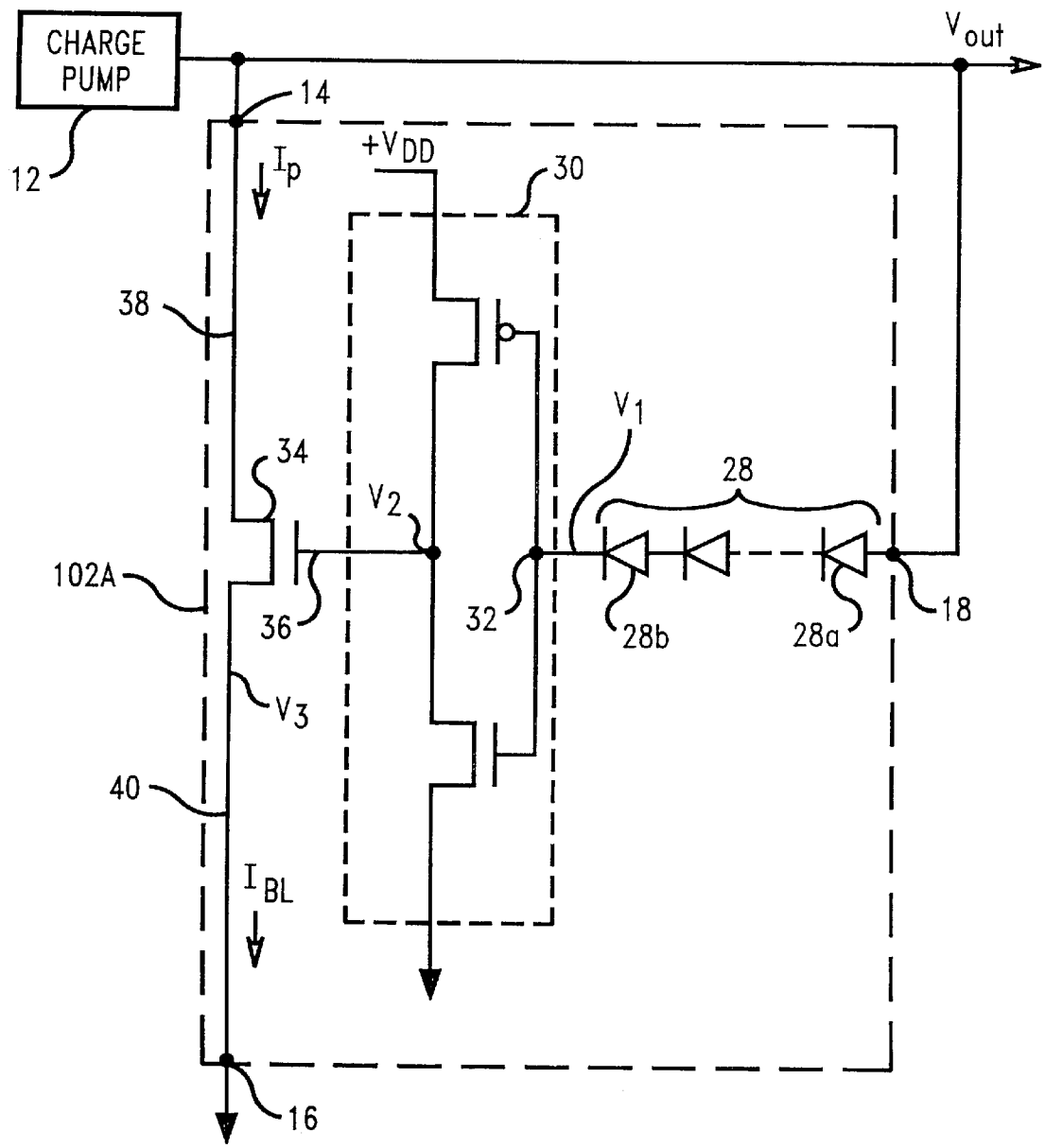
FIG. 2A is a circuit diagram of another embodiment of the present invention.

Another embodiment of the ramp-up rate control circuit of the present invention is shown as circuit 102A in FIG. 2A. Circuit 102A comprises diodes 28 arranged in series, inverter 30, and n-channel MOSFET 34. Drain 38 of FET 34 is connected to input 14 which is connected to the charge pump output. Source 40 of FET 34 is connected to output 16 which is connected to ground potential. Inverter 20 is preferably in the form of an integrated circuit. Diodes 28 are arranged in series so as to act as voltage shifting elements that provide a series of voltage drops. The anode of first diode 28a is connected to control input 18 which is connected to the charge pump output voltage $V_{out}$. The cathode of the last diode 28b is connected to input 32 of inverter 30. The number of diodes connected in series determines voltage $V_1$ at input 32 of inverter 30. Thus, diodes 28 convert the charge pump output voltage $V_{out}$ to voltage $V_1$ which is less than $V_{out}$. The magnitude of voltage $V_1$ is either in a first range of magnitudes that constitute a logic "1" (or high input) or a second range of magnitudes that constitute a logic "0" (or low input) to the inverter. A single zener diode may be used in place of diodes 28.

When the magnitude of $V_1$ is a logic "0", inverter 30 outputs a voltage $V_2$ that is a logic "1". Voltage $V_2$ is inputted into gate 36 of FET 34. When a logic "1" voltage is inputted into gate 36, an electrically conductive path is established between drain 38 and source 40 thereby allowing charge pump bleed current $I_p$ to flow to ground potential. When $V_1$ is a logic "1", inverter 30 outputs voltage $V_2$ that is a logic "0". When a logic "0" voltage is inputted into gate 36, drain 38 becomes substantially electrically isolated from source 40 thereby substantially eliminating the flow of charge pump bleed current $I_p$ to ground potential. A p-channel MOSFET, with the appropriate circuit modifications, may be used in place of n-channel MOSFET 34.

Figure 2B:
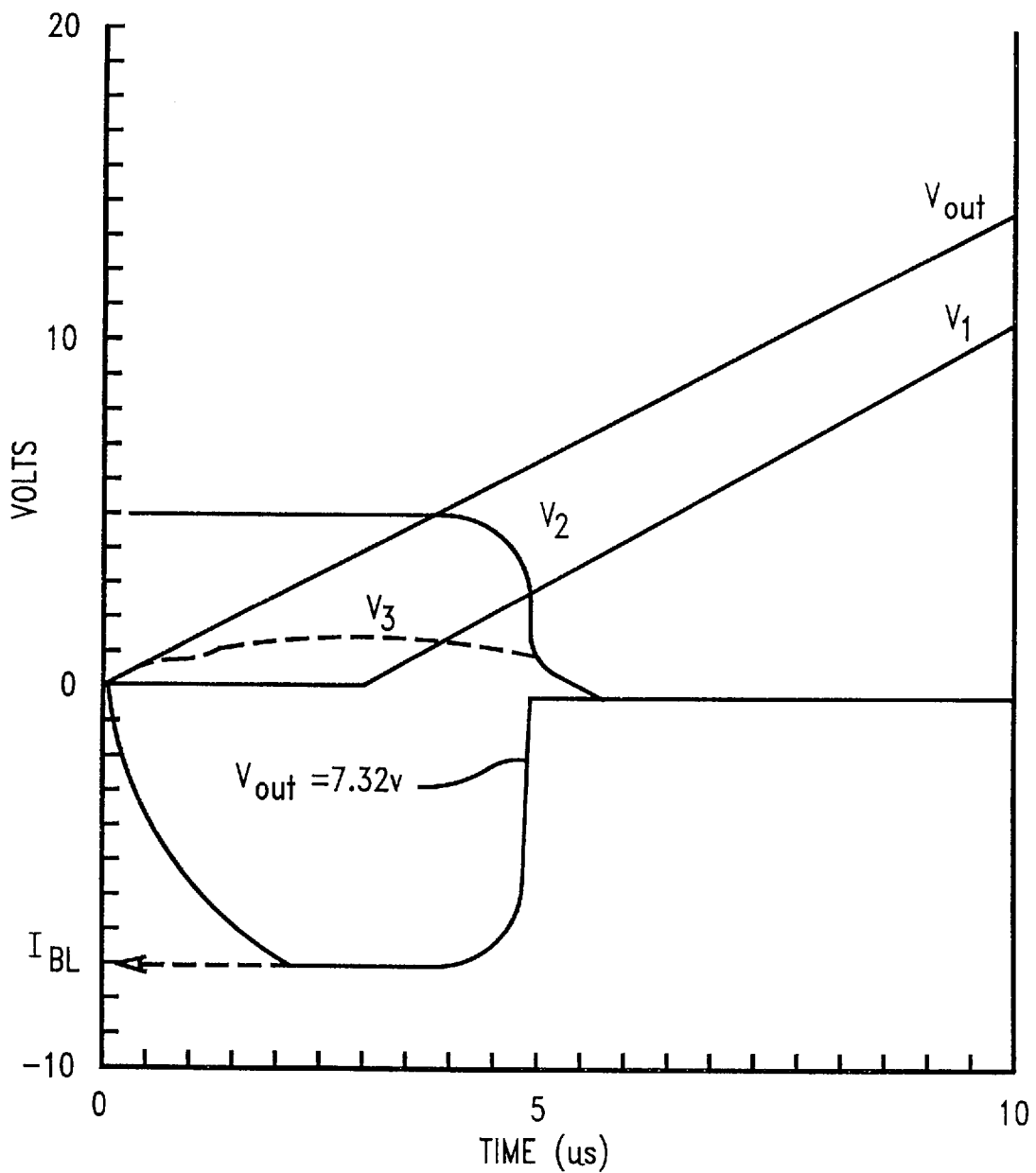
FIG. 2B is a graph of the operating characteristics of the embodiment of FIG. 2A.

The number of diodes 28 determines the magnitude of the charge pump output voltage $V_{out}$ that causes FET 34 to substantially electrically isolate drain 38 from source 40 so as to "turn off" the current bleeding path between the charge pump output and ground potential. Thus, diodes 28 and inverter 30 form a network that controls the potential of gate 36 so as to control the flow of current from drain 38 to source 40. The charge pump output voltage $V_{out}$ having a magnitude that turns off the current bleeding path is referred to herein as $V_{OFF}$. As shown by the graph of FIG. 2B, nine (9) diodes effects substantial elimination of the current path to ground potential when the charge pump output voltage $V_{out}$ is about 7.32 volts. Similarly, when ten (10) and eleven (11) diodes are used, the current bleeding path is turned off when $V_{out}$ is about 7.81 volts and about 8.41 volts, respectively. The width of the n-channel of FET 34 determines the maximum current flowing through the current bleed path.

Figure 3A:
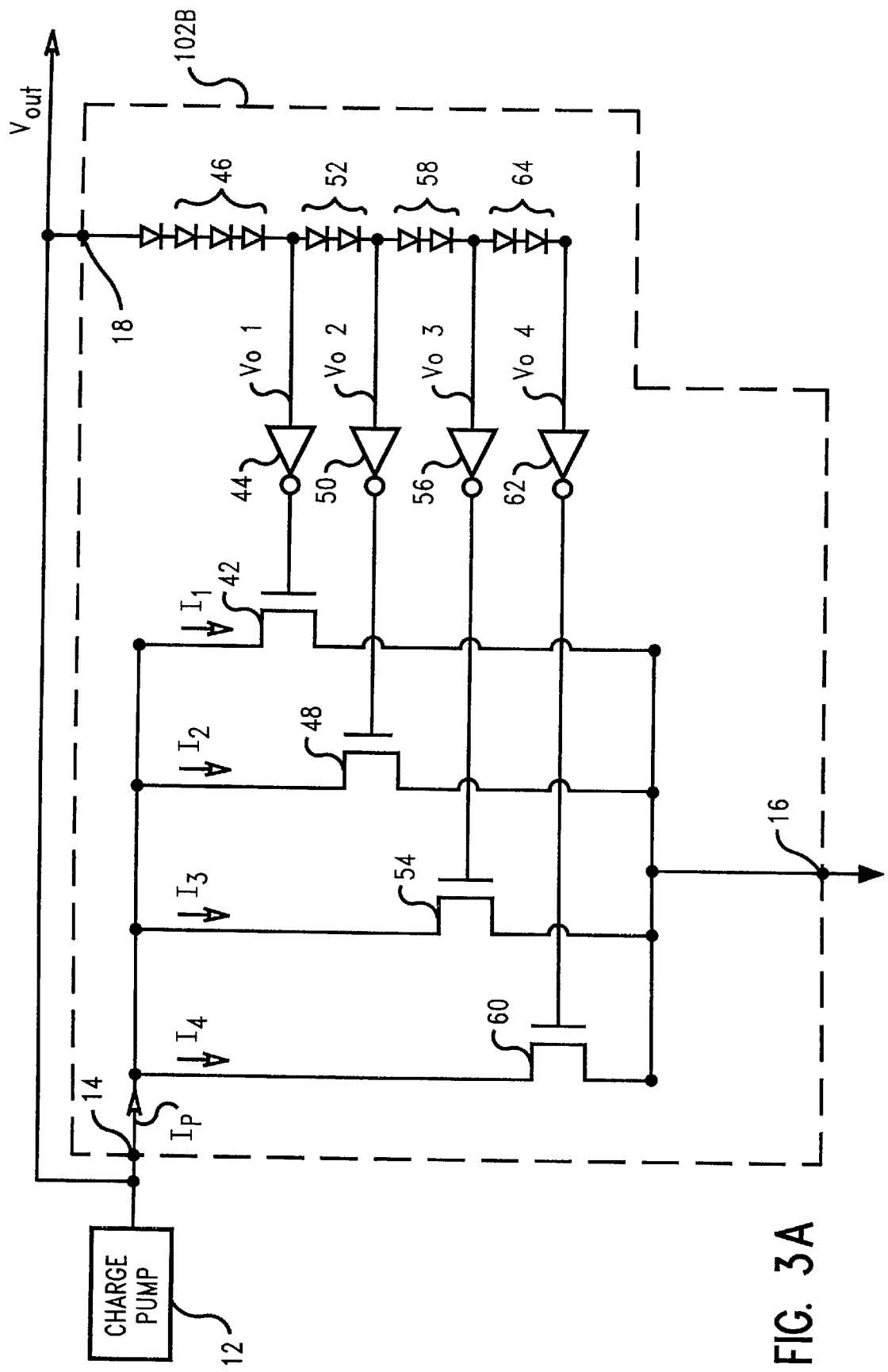
FIG. 3A is a circuit diagram of a further embodiment of the present invention.

FIG. 3A shows an alternate embodiment of the ramp-up control circuit of the present invention. Circuit 102B comprises multiple-current bleed paths wherein each path is configured as the circuitry shown in FIG. 2A. As shown in FIG. 3A, four (4) current bleed paths are used. Multiple-bleeding paths effect accurate control of bleeding current to ground potential for varying magnitudes of charge pump output voltage $V_{out}$. The total charge pump bleed current $I_P$ is comprised of the four branch currents $I_1, I_2, I_3$ and $I_4$. Each current bleed path has a corresponding turn-off voltage ($V_{OFF}$) that will turn off that particular bleed path. The first current bleed path is through n-channel FET 42 which is controlled by inverter 44 and diodes 46. The second current bleed path is through n-channel FET 48 which is controlled by inverter 50 and diodes 46 and 52. The third current bleed path is through FET 54 which is controlled by inverter 56 and diodes 46, 52 and 58. Similarly, the fourth current bleed path is through FET 60 which is controlled by inverter 62 and diodes 46, 52, 58 and 64. Although four (4) current paths are shown, the embodiment shown in FIG. 3A may be modified to have more or less than four (4) current paths. It is to be understood that the quantities of diodes 46, 52, 58 and 64 shown in FIG. 3A are for purposes of discussion only. The actual required quantities of diodes depends upon the desired operating characteristics.

Figure 3B:
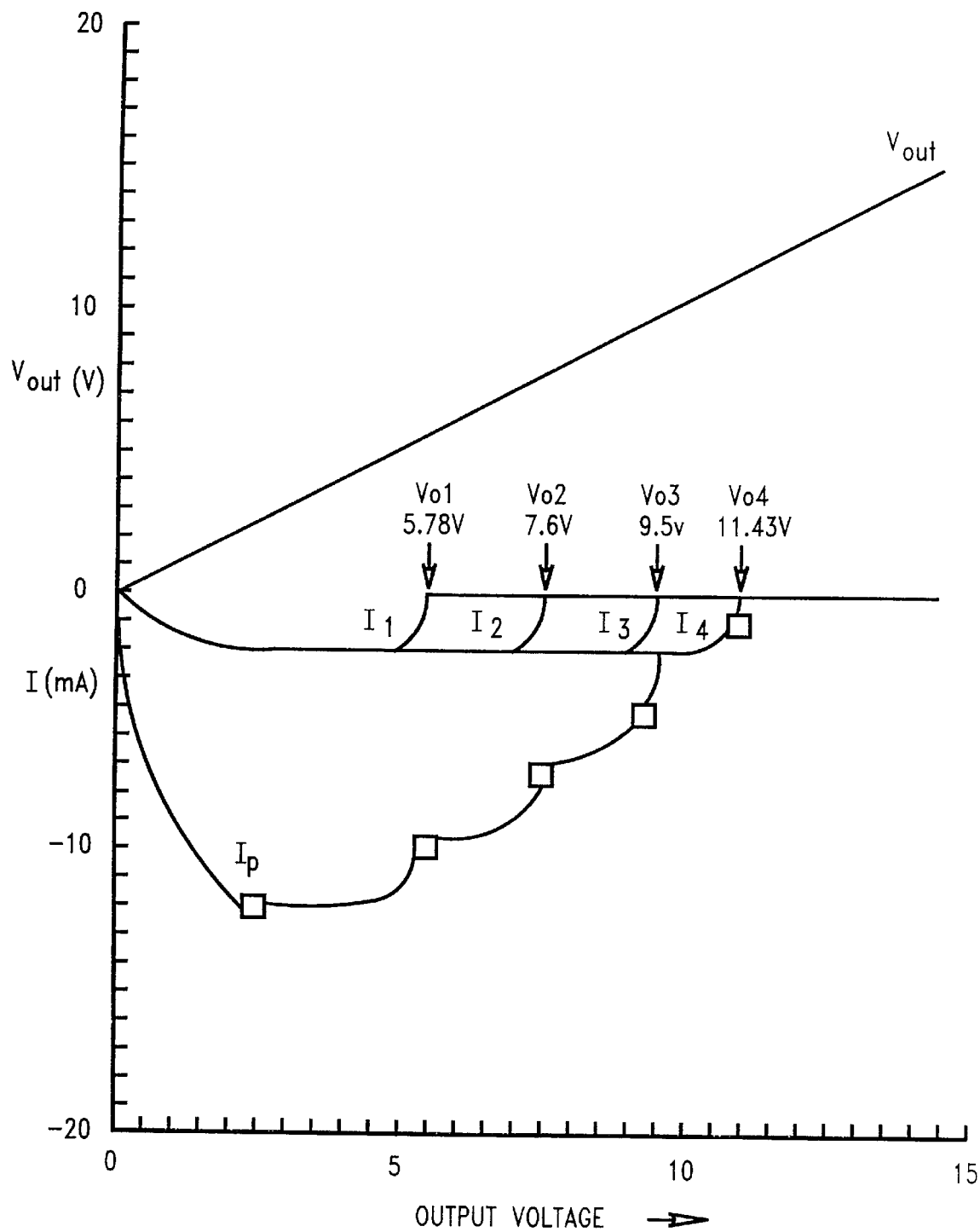
FIG. 3B is a graph of the operating characteristics of the embodiment shown in FIG. 3A.

Referring to FIGS. 3A, 3B and Table 1, the first current bleed path is turned off first when charge pump output voltage $V_{out}$ is about 5.78 volts. When $V_{out}$ is about 5.78 volts, diodes 46 produce a series of voltage drops that produce a voltage $V_{01}$ which has a magnitude that constitutes a logic "1" voltage. In response to this logic "1" voltage, inverter 44 outputs a logic "0" voltage level which turns-off FET 42 thereby substantially eliminating the flow of current $I_1$ through FET 42. Increasing the number of diodes 46 will result in a higher charge pump output voltage being needed to turn off the first current bleed path. Similarly, fewer diodes will result in a lower charge pump output voltage being needed to turn off the first current bleed path.

The second current bleed path is turned off when charge pump output voltage $V_{out}$ is about 7.6 volts. When $V_{out}$ is about 7.6 volts, diodes 46 and 52 produce a series of voltage drops that produce a voltage $V_{02}$ that has a magnitude that constitutes a logic "1" voltage. In response to this logic "1" voltage, inverter 50 outputs a logic "0" voltage level which turns-off FET 48 so as to substantially eliminate the flow of current $I_2$ through FET 48.

The third current bleed path is turned off when charge pump output voltage $V_{out}$ is about 9.5 volts. When $V_{out}$ is about 9.5 volts, diodes 46, 52 and 58 produce a series of voltage drops that produce a voltage $V_{03}$ that has a magnitude that constitutes a logic "1" voltage. In response to this logic "1" voltage, inverter 56 outputs a logic "0" voltage level which turns-off FET 54 so as to substantially eliminate the flow of current $I_3$ through FET 54.

The fourth current bleed path is turned off when charge pump output voltage $V_{out}$ about 11.43 volts. When $V_{out}$ is about 11.43 volts, diodes 46, 52, 58 and 64 produce a series of voltage drops that produce a voltage $V_{04}$ that has a magnitude that constitutes a logic "1" voltage. In response to this logic "1" voltage, inverter 62 outputs a logic "0" voltage level which turns-off FET 60 so as to substantially eliminate the flow of current $I_4$ through FET 60.

Table 1 shows the bleed path current contributed to current $I_P$ for varying magnitudes of charge pump output voltage $V_{out}$.

| Total Bleeding Leakage($I_P$) | Output Voltage Range |
| --- | --- |
| $I_{P-I1} + I_2 + I_3 + I_4$ | $2.5 < V_{out} < 5.78$ |
| $I_{P-I2} + I_3 + I_4$ | $5.78 < V_{out} < 7.60$ |
| $I_{P-I3} + I_4$ | $7.60 < V_{out} < 9.50$ |
| $I_{P-I4}$ | $9.5 < V_{out} < 11.43$ |
| $I_{P-0}$ | $11.43 < V_{out}$ |

Figure 4:
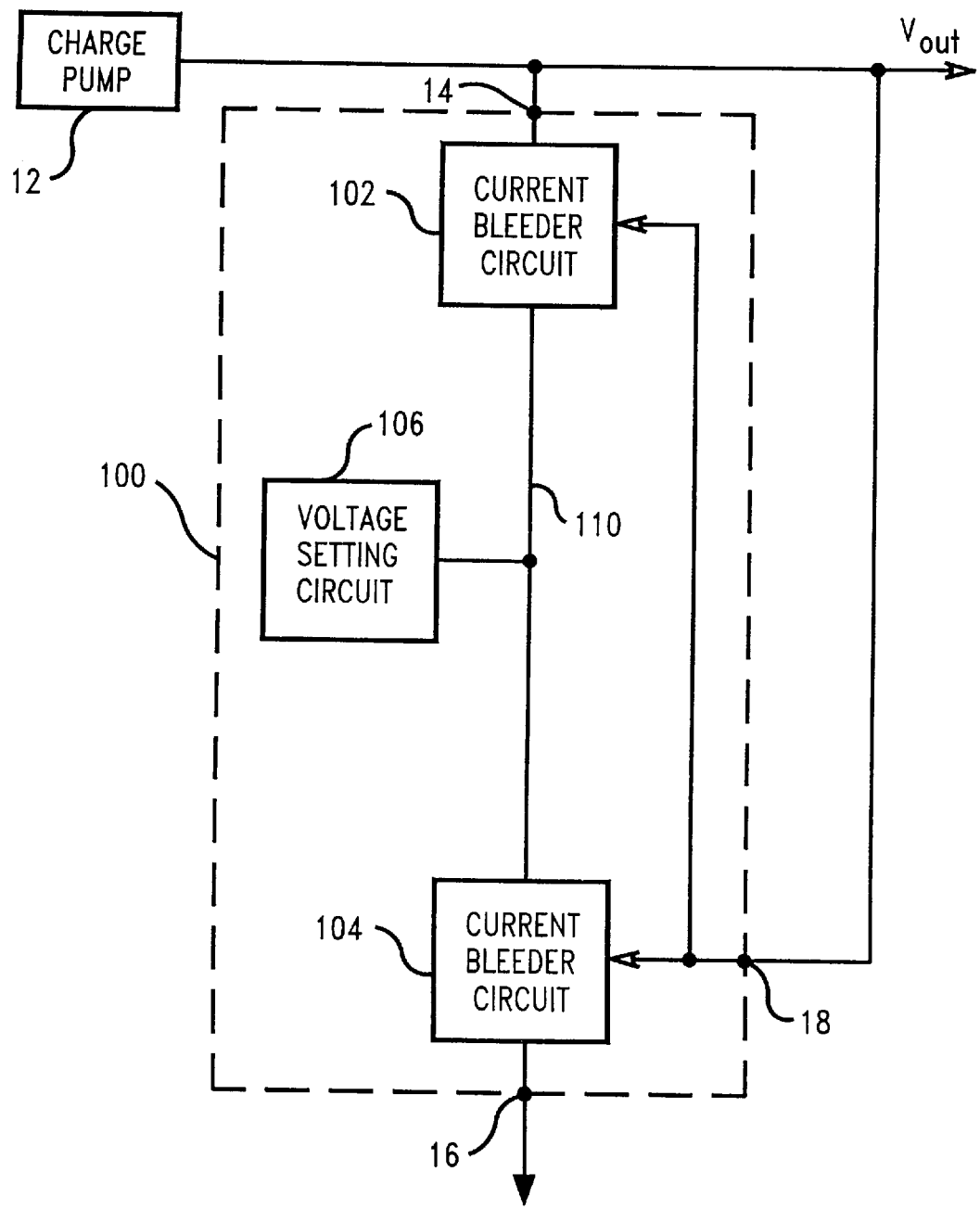
FIG. 4 is a block diagram of a preferred embodiment of the present invention.

FIG. 4 shows a block diagram of a preferred embodiment of the present invention. FIG. 5 is a circuit diagram of the preferred embodiment of FIG. 4. Ramp-up control circuit 100 comprises current bleeder circuit 102, voltage-setting circuit 106 and current bleeder circuit 104. These circuits cooperate to completely turn off the current bleed path to prevent the flow of charge pump bleed current to ground potential when the magnitude of $V_{out}$ is at a predetermined level.

As described above, circuit 102 acts as a switch through which the flow of charge pump bleed current $I_P$ is controlled. The control of the flow of current is a function of the magnitude of the charge pump voltage $V_{out}$. Preferably, circuit 102 is configured as circuit 102B shown in FIG. 3A. The sources of FETs used in circuit 102B are connected together to form a single current output line 110 which is inputted into current bleeder circuit 104. Circuit 102 includes series diodes associated with each current bleed path, as described above for FIG. 3A, for determining a corresponding magnitude of $V_{out}$ ($V_{OFF}$) that will turn off that particular bleed path. The series diodes associated with each current path produce a voltage having a magnitude that constitutes a logic "0" magnitude when the charge pump output voltage magnitude is less than $V_{OFF}$. The series diodes also produce a voltage having a magnitude that constitutes a logic "1" magnitude when the charge pump output voltage magnitude is greater than or equal to $V_{OFF}$. As described above, an inverter associated with the current bleed path receives that voltage produced by the series diodes and in response to such voltage, controls a corresponding FET to permit or inhibit charge pump bleed current $I_P$ to flow from the FET drain to the FET source.

Preferably, circuit 104 is configured as the p-channel FET shown in FIG. 1B. Circuit 104 comprises FET 112 which has its source 114 connected to node 110. Node 110 is connected to the sources of all the FETs in current bleeder circuit 102. The body or n-well 116 of FET 112 is connected to the charge pump output voltage $V_{out}$. Thus, the body potential of FET 112 is modulated by the charge pump output voltage. Drain 118 is connected to gate 120 and to ground potential via output 16. Circuit 104 functions in the same manner as described above for the circuit shown in FIG. 1B.

Voltage-setting circuit 106 fixes the node at 110 and therefore controls $V_{GS}$ of FET 112 of circuit 104. When the $|V_{GS}|$ is less than the threshold voltage $|V_{TH}|$, FET 112 is turned off, i.e. current will not flow from source 114 to drain 118. Voltage-setting circuit 106 comprises differential amplifier 126 and constant current source 128. Differential amplifier 126 comprises FETs 130, 132, 134 and 136. Constant current source 128 comprises FETs 144, 146 and 148 which are configured in a manner well known in the art. A reference voltage $V_{REF}$ is applied to the gate of FET 130. Thus, when circuit 104 is operating such that current $I_B$ is flowing to ground potential, the voltage at node 110 is the same as $V_{REF}$. Preferably, $V_{REF}$ is about 4.0 volts and the supply voltage $V_{DD}$ is about 5.0 volts.

Due to the high input resistance of FET 136, current $I_A$ flowing into the gate of FET 136 is very small, i.e. in the picoampere range. Node 140 is defined by the anode of diode 142, the drain of FET 136 and the source of FET 134. Diode 142 acts as a blocking diode and directs the flow of current $I_C$ from node 140 to node 110 and prevents current from flowing into voltage-setting circuit 106. Current $I_C$ is minimal (in the picoampere range) and thus, substantially the entire current flow $I_B$ is comprised of the portion of charge pump bleed current $I_P$ flowing through the current bleed paths produced by circuit 102.

When the charge pump output voltage $V_{out}$ reaches a predetermined magnitude, the threshold voltage $|V_{TH}|$ of FET 112 becomes greater than $|V_{GS}|$ thus "turning off" FET 112 and preventing current flow from flowing therethrough. Thus, voltage-setting circuit 106 controls the $V_{GS}$ of both the p-channel FETs of circuit 104 and the source voltage of the n-channel FETs of circuit 102 which effects control of the amount of charge pump current flowing through the bleeding path to ground potential. The charge pump ramp-up rate or speed is controlled by varying the amount of current flowing through the bleed path. As the charge pump output voltage $V_{out}$ is gradually increased, the resistance through the current bleeding path increases. When the charge pump output voltage $V_{out}$ reaches a predetermined level, the bleeding path will be completely turned off by both circuits 102 and 104.

Figure 6:
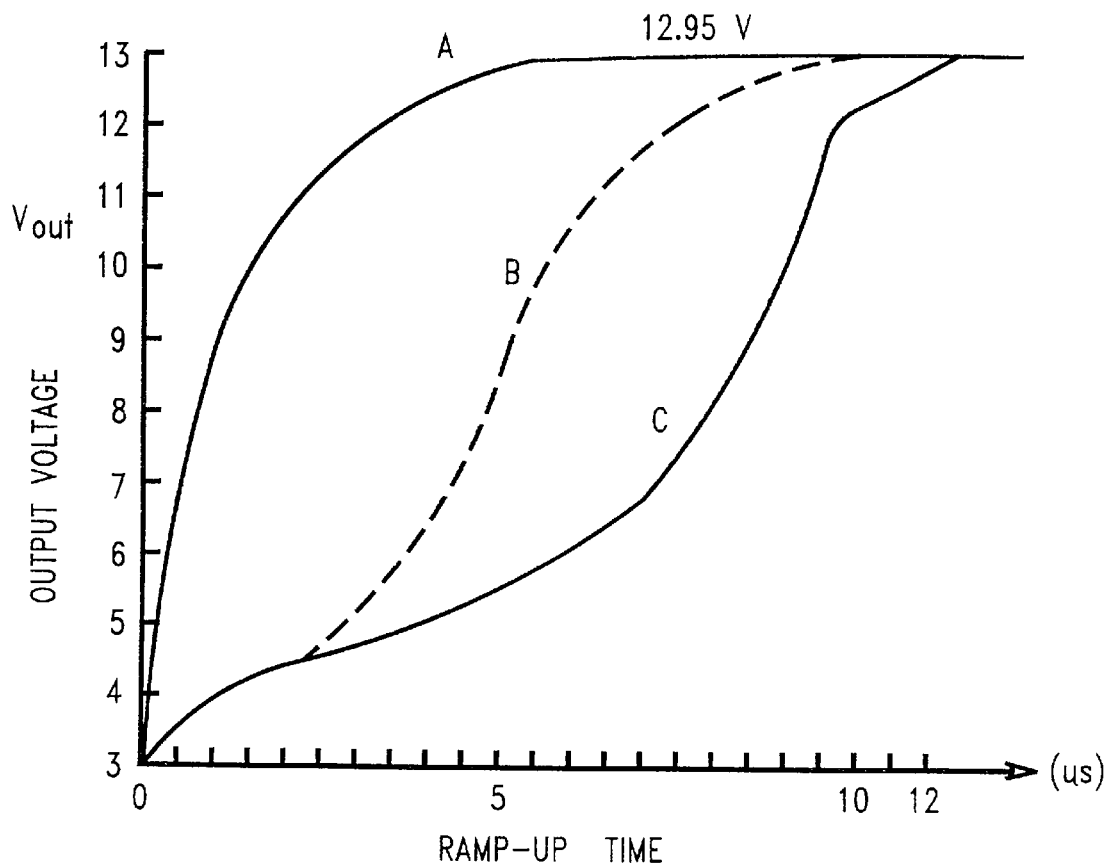
FIG. 6 is a graph showing charge pump ramp-up rate without the ramp-up rate control apparatus of the present invention, with the ramp-up rate control apparatus of the present invention configured as shown in FIG. 2A and with the ramp-up rate control apparatus of the present invention configured as shown in FIG. 5.

FIG. 6 shows a comparison of the charge pump ramp-up rate with and without the ramp-up rate control circuit of the present invention. Referring to Curve A, the ramp-up time without the ramp-up rate control circuit of the present-invention is about 3 us (microseconds) for a maximum charge pump output voltage $V_{out}$ of about 12.96 volts. Referring to Curve B, the ramp-up time with the circuit 102B of FIG. 3A is about 8 us (microseconds) for the same maximum charge pump output voltage. Referring to Curve C, the ramp-up time with the circuit 100 of FIG. 5 is about 12 us (microseconds) for the same maximum charge pump output voltage. Thus, the ramp-up rate of the programming voltage pulse is significantly reduced thereby preventing the peak tunneling current from overstressing the thin tunneling oxide layer of the flash memory device.

The slope of Curves B and C shown in FIG. 6 may be varied by adjusting the operating parameters of the circuits 102, 104 and voltage-setting circuit 106. For example, the channel widths of the FETs in circuits 102 and 104 may be varied to increase or decrease the current flowing through the FETs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit having an input adapted for connection to the charge pump output and an output connected to the bleeder circuit input, the control circuit providing a voltage potential to the input of the current bleeder circuit to control the gate-to-source voltage of the current bleeder circuit transistor;

wherein said current bleeder circuit is adapted to permit the flow of current through the current path of the current bleeder circuit as a function of the magnitude of the charge pump output voltage and the gate-to-source voltage of the bleeder circuit transistor.

2. The apparatus according to claim 1 wherein the control circuit comprises:

a current controlling circuit having an input defining the control circuit input and an output defining the control circuit output, the connection of the control circuit output and the bleeder circuit input defining a node, the current controlling circuit allowing charge pump bleed current to flow therethrough to the node; and a voltage setting circuit for maintaining the node at the voltage potential to control the gate-to-source voltage of the current bleeder circuit transistor.

3. The circuit according to claim 2 wherein the current controlling circuit comprises:

a first circuit having an input defining the current controlling circuit input and an output defining the current controlling circuit output, the first circuit comprising a transistor having a gate, source, and drain, the transistor defining a current path between the source and drain to form a current path between the first circuit input and first circuit output; and a second circuit for outputting a signal to the gate of the first circuit transistor to (1) substantially isolate the first circuit input from the first circuit output when the magnitude of the charge pump output voltage is greater than or equal to a predetermined magnitude, and (2) couple the first circuit input to the first circuit output when the magnitude of the charge pump output voltage is less than the predetermined magnitude.

4. The apparatus according to claim 2 wherein the current controlling circuit comprises:

a first circuit having an input defining the current controlling circuit input and an output defining the current controlling circuit output, the first circuit comprising a plurality of transistors, each transistor having a gate, source and drain and defining a current path between the first circuit input and first circuit output; and a second circuit comprising a plurality of networks, each network having an output connected to the gate of a corresponding first circuit transistor, each network determining for each first circuit current path a particular magnitude of the charge pump output voltage wherein the network outputs a signal to the gate of the corresponding first circuit transistor to (1) substantially eliminate current flow through the current path when the magnitude of the charge pump output voltage is greater than or equal to the predetermined magnitude, and (2) allow current flow through the current path when the magnitude of the charge pump output voltage is less than the predetermined magnitude.

5. An apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit comprising:

a first circuit having an input adapted for connection to the charge pump output and an output connected to the current bleeder circuit, the first circuit comprising a transistor having a gate, source, and drain, the transistor defining a current path between the source and drain to form a current path between the first circuit input and first circuit output, the connection of the first circuit output and the current bleeder circuit input defining a node, a second circuit for outputting a signal to the gate of the first circuit transistor to (1) substantially isolate the first circuit input from the first circuit output when the magnitude of the charge pump output voltage is greater than or equal to a predetermined magnitude, and (2)

couple the first circuit input to the first circuit output when the magnitude of the charge pump output voltage is less than the predetermined magnitude, and a voltage setting circuit for maintaining the node at a voltage potential to control the gate-to-source voltage of the current bleeder circuit transistor; and wherein said current bleeder circuit is adapted to permit the flow of current through the current path of the current bleeder circuit as a function of the magnitude of the charge pump output voltage and the gate-to-source voltage of the bleeder circuit transistor.

6. An apparatus for controlling the ramp-up rate of a charge pump having an output providing an output voltage and an output current, the apparatus comprising:

a current bleeder circuit having an input, an output adapted for connection to ground potential and at least one transistor having a gate, source, drain and body and defining at least one current path between the source and drain to form a current path between the input and output, the body being adapted for connection to the charge pump output; and a control circuit comprising:

a first circuit having an input adapted for connection to the charge pump output and an output connected to the current bleeder circuit, the first circuit comprising a plurality of transistors, each transistor having a gate, source and drain and defining a current path between the first circuit input and first circuit output, the connection of the first circuit output and the current bleeder circuit input defining a node, and a second circuit comprising a plurality of networks, each network having an output connected to the gate of a corresponding first circuit transistor, each network determining for each first circuit current path a particular magnitude of the charge pump output voltage wherein the network outputs a signal to the gate of the corresponding first circuit transistor to (1) substantially eliminate current flow through the first circuit current path when the magnitude of the charge pump output voltage is greater than or equal to the predetermined magnitude, and (2) allow current flow through the first circuit current path when the magnitude of the charge pump output voltage is less than the predetermined magnitude, and a voltage setting circuit for maintaining the node at a voltage potential to control the gate-to-source voltage of the current bleeder circuit transistor; and wherein the flow of current through the current path of the current bleeder path is a function of the magnitude of the charge pump output and the gate-to-source voltage of the bleeder circuit transistor.

7. An apparatus for controlling the ramp-up rate of a charge pump having an output providing an output voltage and an output current, the circuit comprising:

a current bleeder circuit having an input, an output adapted for connection to ground potential and a P-FET transistor having a gate, source, drain and body and defining at least one current path between the source and drain to form a current path between the input and output, the gate being connected to the drain and the body being adapted for connection to the charge pump output; and a control circuit comprising:

a current controlling circuit having an input adapted for connection to the charge pump output and an output connected to the input of the current bleeder circuit, the connection of the current controlling circuit output and the bleeder circuit input defining a node, the current controlling circuit allowing charge pump bleed current to flow therethrough to the node, and a voltage-setting circuit for maintaining the node at a voltage potential to control the gate-to-source voltage of the current bleeder circuit transistor; and wherein said current bleeder circuit is adapted to permit the flow of current through the current path of the current bleeder circuit as a function of the magnitude of the charge pump output voltage and the gate-to-source voltage of the bleeder circuit transistor.

8. An apparatus for controlling the ramp-up rate of a charge pump having an output providing an output voltage and an output current, the apparatus comprising:

a first circuit having an input adapted for connection to the charge pump output and an output adapted for connection to ground potential, the first circuit having a transistor having a gate, source, and drain, the transistor defining a current path between the source and drain to form a current path between the first circuit input and first circuit output; and a second circuit for outputting a signal to the gate of the first circuit transistor to (1) substantially isolate the first circuit input from the first circuit output when the magnitude of the charge pump output voltage is greater than or equal to a predetermined magnitude, and (2) couple the first circuit input to the first circuit output when the magnitude of the charge pump output voltage is less than the predetermined magnitude.

9. An apparatus for controlling the ramp-up rate of a charge pump having an output providing an output voltage and an output current, the apparatus comprising:

a first circuit having an input adapted for connection to the charge pump output and an output adapted for connection to ground potential, the first circuit having a plurality of transistors, each transistor having a gate, source and drain and defining a current path between the first circuit input and first circuit output; and a second circuit comprising a plurality of networks, each network having an output connected to the gate of a corresponding first circuit transistor, each network determining for each current path a particular magnitude of the charge pump output voltage wherein the network outputs a signal to the gate of the corresponding transistor to (1) substantially eliminate current flow through the first circuit current path when the magnitude of the charge pump output voltage is greater than or equal to the predetermined magnitude, and (2) allow current flow through the first circuit current path when the magnitude of the charge pump output voltage is less than the predetermined magnitude.

* * * * *

UNITED STATES PATENT AND TRADEMARK OFFICE
CERTIFICATE OF CORRECTION

PATENT NO. : 5,872,733
DATED : Feb. 16, 1999
INVENTOR(S) : Buti et al.

It is certified that error appears in the above-identified patent and that said Letters Patent is hereby corrected as shown below:

Title Page:   Item [22] insert: Related U.S. Application Data:

Item [62]

-- -- Continuation-in-part of Serial No. 08/466,558, June 6,1995, abandoned.-- --

Signed and Sealed this

Fourth Day of January, 2000

Attest:

Attesting Officer    *Acting Commissioner of Patents and Trademarks*